United States Patent [19]

Wang et al.

[11] Patent Number: 5,113,238
[45] Date of Patent: May 12, 1992

[54] CONTACTLESS NON-VOLATILE MEMORY ARRAY CELLS

[76] Inventors: Chen-Chin Wang, 7880 Creekline Dr., Cupertino, Calif. 95014; Yeun-Ding G. Hong, 1686 Hadeock Ct., San Jose, Calif. 95132; Stephen S. Chiao, 20437 Kilbride Ct., Saratoga, Calif. 95070

[21] Appl. No.: 294,318

[22] Filed: Jan. 6, 1989

[51] Int. Cl.$^5$ .................. H01L 29/34; H01L 29/68; H01L 27/10
[52] U.S. Cl. ................................. 357/54; 357/236; 357/45
[58] Field of Search ............... 357/54, 54 A, 54 G, 357/54 M, 54 N, 54 S, 23.6, 45

[56] References Cited

U.S. PATENT DOCUMENTS

| | | |
|---|---|---|
| 4,094,057 | 6/1978 | Bhattacharyya .................. 354/54 |
| 4,475,964 | 10/1984 | Ariizumi ........................... 357/54 |
| 4,649,406 | 3/1987 | Takemae ........................... 357/54 |
| 4,698,787 | 10/1987 | Mukerjee .......................... 357/54 |

*Primary Examiner*—Rolf Hille
*Assistant Examiner*—Wael Fahmy

[57] ABSTRACT

A non-volatile MOS memory array cell in which polycide bit lines are connected via self-aligned buried contacts to shared drain regions and run continuously over, but are electrically isolated from, shared source regions. Self-aligned buried contact windows are obtained by depositing and anisotropically etching-back an oxide layer with a non-critical mask. Preferably N-type doped polycide provides bit lines and self-aligned buried contacts with low resistance, low current leakage to the substrate, and good step coverage without bit line bridging. It is expected that this invention will make it feasible to manufacture high density non-volatile memory array products with good yield rates.

8 Claims, 11 Drawing Sheets

CONTACTLESS NON-VOLATILE MEMORY ARRAY CELLS

BACKGROUND OF THE INVENTION

1. Field of the Invention

The present invention relates generally to semiconductor devices and more particularly to MOSFET array cell contacts.

2. Discussion of the Prior Art

FIG. 1 shows the layout of a conventional channel implant programming read only memory (ROM) cell array. There is, for example, one cell PR1 defined in the rectangular area AB×AD inside corner points A, B, C and D, having a shared (active) source region CS1, polycrystalline silicon (or polycide) gate or word line WL1, and a shared (active) drain region CD with a shared drain contact CC to an overlying metal bit line BL.

FIG. 2A is a cross-section through the FIG. 1 cells along line 2A—2A from lower shared source region CS1 lengthwise along channel CHN1, across shared drain contact CC, and along channel CHN2 to upper shared source region CS2. Channel conductivities may be programmed by implanting Boron at a high energy (around 180 Kev) and dosage (around 1E13) through the polysilicon gates into the channel regions CHN1, CHN2. Cell PR1's vertical dimensions AD, BC extend from the middle of shared source region CS1 to the middle of shared drain contact CC. The vertical dimensions depend upon, and to be scaled down require reducing at least one of, the drain contact CC size, the drain contact CC spacing from gate WL1, the channel CHN1 length (i.e., word line WL1 width) and the shared source region CS1 height.

FIG. 2B is a cross-section along line 2B—2B through FIG. 1 cells PR1 and PR2. Cell PR1's horizontal dimension AB, DC extend from the center of the gap left of metal bit line BL to the center of the gap right of the bit line. The horizontal dimensions depend upon, and to be scaled down require reducing, each of the active drain region vertical column-to-column spacing, drain contact CC size, active drain region overlap of drain contact CC, metal bit line BL overlap of drain contact CC, and metal bit line-to-metal bit line spacing or gap size.

Such ROM cells designed using a 1.0 um design rule range in area from 10 to 15 um² and can have densities of up to 2 megabits in dies with reasonable sizes and manufacturing yields. Smaller cell areas and higher cell densities require more aggressive (tighter) design rules, but pushing technology limits generally impairs manufacturing yields. Reducing contact size increases the likelihood that contact windows through passivation will be blocked. Even the open windows' steep side steps are generally poorly covered by deposited metal (as shown in FIGS. 2A and 2B). Strained metal coverage reduces contact reliability. Metal layers for bit lines are harder to define than other layers of semiconductor devices because passivation surface topologies and metal surfaces are rough, and metal films are strongly reflective in the metal masking step. Narrow metal-to-metal spacings facilitate metal-to-metal bit line bridging. Close active region contact-to-gate spacing, and possible misalignment and/or over-etching of non self-aligned drain contact windows, may cause bit lines to short to word lines. Small metal overlap of drain contacts, if part of the contact interface area is exposed during plasma metal etching, may permit trenches in the substrate silicon. Small active drain region overlaps of drain contacts may cause drain junction leakage currents, which can result in logic operation errors. Reducing aluminum contact size may increase Al contact-Si substrate interface resistance.

FIGS. 3A and 3B show a through-hole programming ROM cell described by Masuoka on pp. 146–147 of the Digest of the Integrated Solid State Circuit Conference (ISSCC) 1984. Fabrication of such a cell would need one extra mask for windows to expose the substrate for formation of non-self-aligned buried contacts 100, and a second extra mask for patterning the pad (second) polysilicon layer 102. Metal (Al) contacts 104 are formed on the polysilicon pads 102, which are electrically isolated from the gate (first) polysilicon 106. As long as metal contacts 104 remain within pad polysilicon 102, the metal bit lines 108 will not short to the gates 106, which eliminates the requirement of minimum spacing between the metal contacts and gates and allows reducing the cell size. However, minimum spacings must still be maintained to prevent short circuits between the non-self-aligned buried contacts 100 and gates 106. The size of such a through-hole programming type ROM cell is actually larger than a conventional implant programming type ROM because through-hole programming at the contact mask prevents adjacent cells from sharing drain contact/diffusions, which would short together the adjacent cells. Non-sharable drain contact/diffusion design rules require minimum spacings between drain diffusions and between polysilicon pads for adjacent cells.

Other approaches to scaling down sizes of transistor or memory cells are described for MOS devices in U.S. Pat. No. 4,707,457 entitled "Method For Making Improved Contact For Integrated Circuit Structure" by Erb, and for bipolar devices in U.S. Patent No. 4,586,968 entitled "Process Of Manufacturing A High Frequency Bipolar Transistor Utilizing Doped Silicide With Self-Aligned Masking" by Coello-Vera. These two processes use oxide deposition and etch-back to form self-aligned buried contacts under individual polysilicon pads.

As shown in FIG. 4A, Erb uses a silicon substrate 20, gate oxide 22, polysilicon gate 24 capped with thick (around 6000 angstrom) oxide layer 28, lightly N-doped (LDD) source/drain region 52, and (2000 to 3000 angstrom) oxide layer 60. As shown in FIG. 4B, Erb applies a contact mask 66 of photoresist aligned over polysilicon gates 24 and over oxide layer 60. Since there are as yet no heavy N++ dopants in the source (or drain) regions, all of the source (and drain) regions need to be exposed after the oxide etching process. Oxide 60 is anisotropically etched to open windows 68 exposing surfaces of LDD regions 52 while preserving oxide spacers 62 adjacent the sidewalls of polysilicon gates 24 to provide insulation later needed between gates 24 and poly contacts 74.

As shown in FIG. 4C, a second polysilicon layer 70 is deposited in and over openings 68. Each source and drain region surface having a self-aligned contact opening 68 forbids continuous polysilicon between source and drain regions, which would be short-circuited. Each source and drain contact opening 68 should be occupied by a ("winged") polysilicon pad, without which the vacant contact openings 68 would be deeply trenched during plasma etching of the winged pad polysilicon. Deep trenches pose a metal step coverage problem and result in high diffusion region-to-contact resistance. Polysilicon layer 70 is heavily doped with N-type dopants which diffuse out through LDD regions 52 to lower the resistance of N+ contacts 54. Polysilicon 70 is masked and patterned to form individual polysilicon contacts 74 with winged pads 76.

Over polysilicon pad contacts 74 is formed an oxide layer 80 through which vias 86 are cut to selected pads 74 and filled with metal 90 to connect the selected pads 74. Finally, metal layer 90 is patterned into bit lines 92 as shown in FIG. 4D.

FIG. 5 illustrates a comparable ROM cell layout with winged polysilicon pads 76 over the areas of the shared drain N+ regions 52=CD forming self-aligned contacts, and with an overlying metal contact bit line 92=BL. Over the source CS1 and CS2 polysilicon pads 76, oxide 80 has no via openings for metal contacts 90, which would short source regions CS through the bit line BL to the drain region CD of each cell.

Scaling down ROM cell sizes by either of these prior art approaches of using self-aligned buried contacts and winged polysilicon pads would have the following drawbacks:

1. FIG. 4B photoresist mask 66 lines must be at least as narrow as the length of the gates (i.e., the width of the word lines) 24 to tolerate possible misalignments while insuring sufficient size openings 68 and insuring adequately consistent thickness oxide sidewall spacers 62. Then, photoresist mask 66 does not effectively protect oxide 60 or oxide sidewall spacers 62 on gate 24. Erb omitting photoresist mask 66 would be equivalent to Coello-Vera.

2. The winged polysilicon pads 74 are heavily doped to lower the resistance of the contacted source and drain diffusion regions 54, but the pads' heavy (N+) dopants diffuse quickly into the substrate 20 and may result in drain diffusion-to-drain diffusion "punch-through". The X dimension of the cell size (drain-to-drain spacing) must be large enough, or increased, to avoid punch-through.

3. Similarly, heavy N+ doping diffusion out from the polysilicon pads may cause objectionable short channel effects such as source/drain punch-through, which must be forestalled by lengthening the channel, which increases the Y dimension of the cell size.

4. The polysilicon bit line cannot be replaced by polycide film to lower the bit line resistance because silicide film is susceptible to peeling by the concentrated N+ dopants used in the winged polysilicon contacts to dope the source/drain regions.

5. As with conventional buried polysilicon contacts, undersized (smaller than the defined polysilicon pattern) buried polysilicon contacts in peripheral circuits are impractical due to the very high resistance of the N- active regions 52. This restricts and may enlarge ROM cell layouts.

6. Metal bit lines are needed in ROM memory cells to electrically connect the individual winged pad polysilicon contacts 74 of the drain N+ diffusions 54. Any non-opened windows for metal contacts will incapacitate the corresponding cells, and metal bit lines are plagued by bridging between bit lines.

7. Cell design rules would be enlarged in both the X and Y dimensions to guarantee sufficient overlaps between the underlying winged polysilicon pad and metal contacts and between the metal contacts and the overlying metal of the bit lines.

8. Critical dimensions of the gate, metal (or even polysilicon) step coverage, and word line-to-word line spacing when the gates are covered by a very thick (6000 angstrom) layer of oxide may require increasing the Y dimension of the cell size.

Thus, conventional metal bit line cell structures are not small enough to build very high density memory arrays without sacrificing production yields. There is a need for an improved and more reliable technique of fabricating semiconductor device cells small enough for ultra-high (4 to 16 megabit) density memory array products.

SUMMARY OF THE INVENTION

The present invention provides an improved MOS array device fabricated preferably from a monocrystalline silicon substrate covered with a layer of gate dielectric and with a layer of polycrystalline silicon.

Unlike prior art cells as shown in FIG. 1, the invention grows or deposits several thousand angstroms of protection dielectric on the polycrystalline silicon to form a sandwich layer. The oxide/polysilicon sandwich is patterned to define cell gates or word lines WLN1, WLN2, etc.

Protection dielectric is also provided on the gate sidewalls, and N− LDD regions 44 and N++ regularly doped source and drain regions 45 are formed by conventional process steps.

Next, according to this invention, a layer of isolation dielectric around several thousand angstroms is deposited. A photoresist mask is employed to protect the cell source region and to expose the entire drain region and part of the isolation dielectric overlying the gate WLN. During self-aligned etching of buried contact windows to drain diffusion region surfaces, an isolation dielectric layer protects the source diffusion region surfaces. The exposed isolation dielectric is then etched, preferably by anisotropic plasma etching, down to the surface of the N++ doped drain region. With the entire drain active area (less optional LDD oxide spacers) now being clear of oxide and the mask opening being larger than the drain active area, the invention is able to form self-aligned buried contacts to the drains. A polycide film is preferably deposited and N-type implanted or doped. A photoresist mask is used to define continuous polycide bit lines. Polycide bit line-to-polycide bit line spacing can be very close without risking bit line-to-bit line bridging. The continuous polycide bit lines are ohmically connected via the self-aligned buried contacts to drain diffusion surfaces, but are dielectrically insulated from the word lines by protection dielectric oxide above the word lines and by oxide spacers along the word line (gate) sidewalls, and from the source N++ regions by isolation dielectric. Polycide bit lines can have less overlap with self-aligned buried contacts than conventional metal bit lines. Because no drain contact metal is needed, drain active areas can be reduced, which reduces bit line-drain junction capacitance and cell size. The resistance of the polycide bit lines' self-aligned buried contacts to the drain N++ diffusions is consistently small because of the similar N-type dopants in the polycide bit lines and in the drain N++ regions.

Rather than using critical contact and metal masks as in the prior art, this invention uses two non-critical masks to form high integrity arrays, and enables designing ultra-small size cells and manufacturing ultra large scale memory arrays such as ROMs and EPROMs with excellent yields.

IN THE DRAWING

DESCRIPTION OF THE PREFERRED EMBODIMENTS

Figure 6:
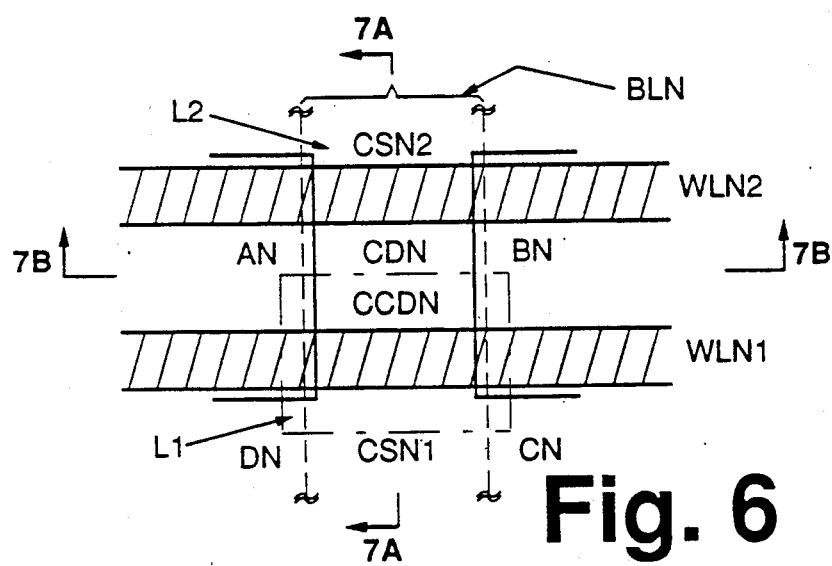
FIG. 6 illustrates the layout of ROM cells according to this invention.

FIG. 6 is a top view of the layout of a ROM cell array in a preferred embodiment of the invention. One cell L1 occupies the rectangular area between corner points AN, BN, CN and DN. ROM cells L1 and L2 have respective gate or word lines WLN1 and WLN2, shared drain (N++) diffusion region CDN (which provides self-aligned buried drain contact CCDN), respective (non-mutually shared) source (N++) diffusion regions CSN1 and CSN2, and shared polycide bit line BLN.

Figure 7A:
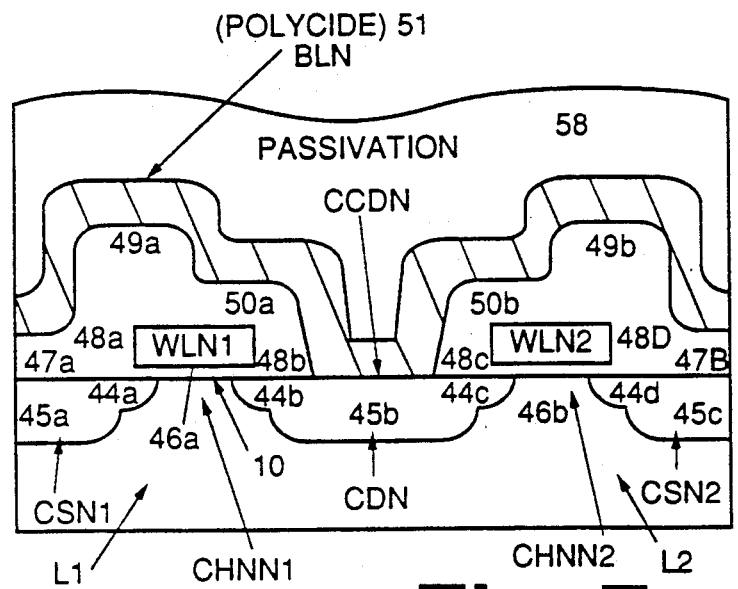
FIG. 7A illustrates ROM cells according to this invention in a cross-section along the direction of the channel length.
Figure 7B:
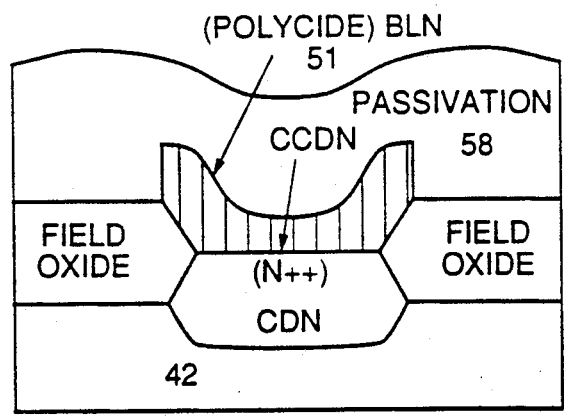
FIG. 7B illustrates ROM cells according to this invention in a cross-section parallel to the direction of the word lines.

FIG. 7A is a cross-section in the direction of arrows 7A—7A along the length of channels CHNN1 and CHNN2 of FIG. 6 cells L1 and L2. FIG. 7B is a cross-section along lines 7B—7B parallel to and midway between the channels. ROM cells L1 and L2 preferably comprise a P-type silicon substrate 42 having an initial planar top surface 10; gate oxide dielectric layers 46a, 46b; polycrystalline silicon gate word lines WLN1 and WLN2 with protective dielectric layers 50a, 50b overlying the gates and spacers 48a, 48c on the left sidewalls and spacers 48b, 48d on the right sidewalls; lightly N-doped LDD source regions 44a, 44d and lightly N-doped LDD drain regions 44b, 44c; heavily N++ doped source regions 45a=CSN1, 45c=CSN2 (shared with the respective adjacent lower and upper cells, not shown); isolation dielectric layers 47a, 47b overlying respective heavily N++ doped source regions 45a, 45c; a shared heavily N++ doped drain diffusion region 45b=CDN; and a conductive (preferably N+ doped polycide) bit line-contact film 51=BLN. Polycide bit line BLN forms a self-aligned buried contact CCDN which is ohmically connected to shared drain diffusion region 45b=CDN and insulated by isolation dielectric 47a, 47b from the respective source diffusion regions 45a=CSN1 and 45c=CSN2 and by protection dielectric 50a, 50b from word lines WLN1 and WLN2. An overlying insulating layer of passivation 58 covers the structure.

Figure 8:
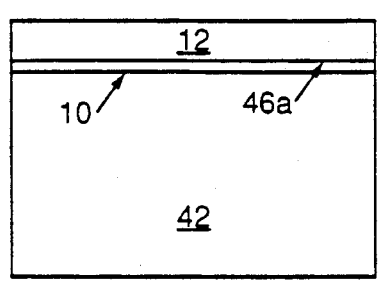
FIGS. 8 through 17 illustrate steps in a preferred process for manufacturing "contactless" ROM cells according to the present invention.

ROM cells L1, L2, etc. are preferably fabricated beginning as shown in FIG. 8 with a monocrystalline silicon substrate 42 doped with P-type dopants to have a resistivity in the range of 10 to 60 ohms/cm$^2$, having an initially planar top surface 10 covered with typically 250 angstroms of thermally grown oxide gate dielectric 46a, 46b. Over gate oxide layers 46 is deposited several thousand angstroms of N+ doped polysilicon 12.

Figure 9:
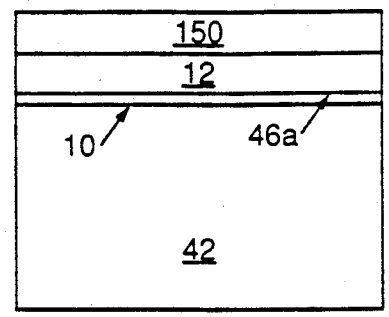

As shown in FIG. 9, over polysilicon 12 is thermally grown or deposited several thousand angstroms of an etch protection dielectric layer or film 150 of oxide. Alternatively, a nitride or composite nitride/oxide film or other suitable protection dielectric could be used.

Figure 10:
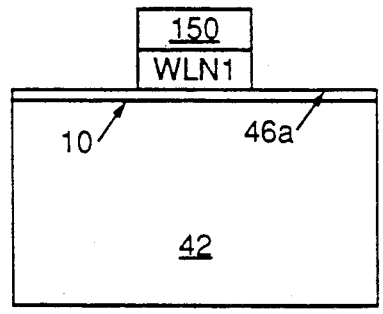

Next, photoresist (not shown) is deposited over etch protection dielectric 150 and patterned to define a mask for the gates (word lines). Anisotropic plasma etching preferably removes the unmasked surface areas of etch protection oxide layer 150 and next the underlying areas of polysilicon 12. The photoresist mask is then stripped to leave patterned polysilicon gates WLN1, etc. topped with etch protection dielectric 150 as shown in FIG. 10. A thin layer of oxide (not shown) may now optionally be thermally grown on the sidewalls of gate word lines WLN1, etc., to passivate the sidewalls of the polysilicon gates.

Figure 11:
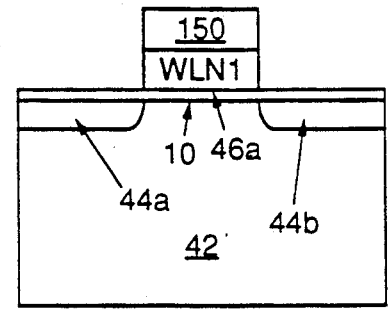

Next, referring to FIG. 11, substrate 42 is implanted as indicated by the downward directed arrows with a selected low dosage (typically to a concentration of 1.0E13 atoms/cm$^2$) of arsenic or of phosphorus to form N- LDD source regions 44a and N- LDD drain regions 44b beneath gate dielectric layers 46.

Figure 12:
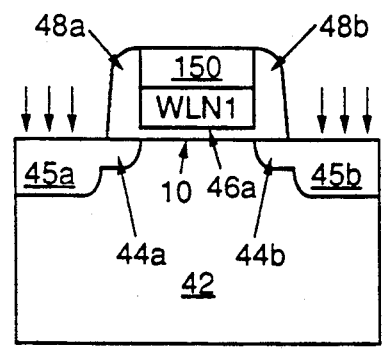

Next is deposited several thousand angstroms of oxide to form a spacer oxide layer. Anisotropic plasma-etching removes horizontal surfaces of the spacer oxide layer over etch protection oxide 150 and over to-be-heavily implanted source region 45a and drain region 45b while not removing vertical surfaces of the oxide. This leaves, as shown in FIG. 12, oxide spacer 48a adjacent the left sidewall of gate WLN1 and oxide spacer 48b adjacent the right sidewall of the gate. Sidewall spacers 48a and 48b (which are not effective in Erb or Coello-Vera before the deposition/self-aligned etching of the protection oxide to form the self-aligned contacts), are important to protect the sidewalls of gates WLN1, WLN2 during etching of windows for the self-aligned contacts. Exposure of the gate word lines would later allow them to short to the bit lines.

A high dosage of around 5E15 atoms/cm$^2$ of arsenic or of phosphorus is then implanted as indicated by the downward directed arrows in FIG. 12 to reinforce the doping of LDD source 44a and LDD drain 44b and thereby form N++ regular source region 45a and N++ regular drain region 45b. Optionally, at this stage a thin oxide layer may be thermally grown on the regular source and drain region surfaces.

To program the channels of the ROM cells, Boron may now be implanted through the gate at an energy of around 180 Kev and in a dosage around 1E13 into the channel regions, which will result in a high threshold voltage above 5.0 volts for the implanted cells.

Figure 13:
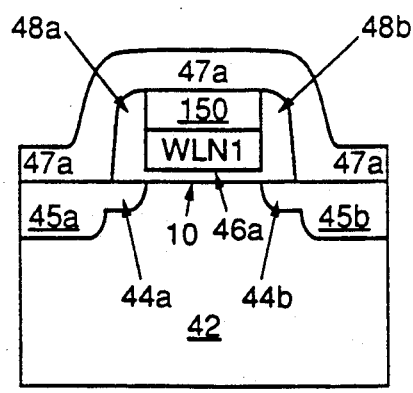

The FIG. 12 structure is then covered with a layer of several thousand angstroms of oxide as isolation dielectric 47a shown in FIG. 13.

Figure 14:
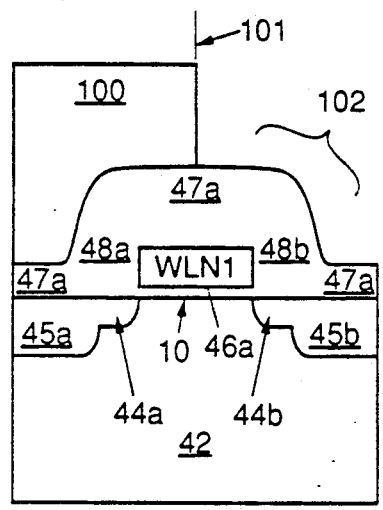

Over isolation oxide 47a, photoresist is deposited and patterned to form a mask 100 as shown in FIG. 14 ending at boundary 101 around a window 102 exposing at least the area of 47a above drain diffusions 44b, 45b and above oxide 150 over the right part of gate WLN1 and at most the entire area above shared drain CDN (as also shown in FIG. 6). Photoresist mask 100 covers isolation oxide 47a above source diffusions CSN1 and CSN2 and above etch protection oxide over the right part of poly gate WLN1. Photoresist mask boundary 101 may fall anywhere between the left and right sidewalls of each word line.

Figure 15:
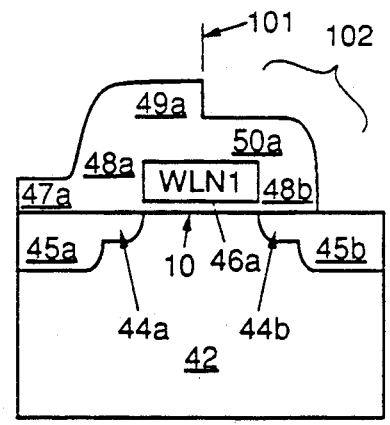

The exposed areas of isolation oxide layer 47a are then etched, preferably by an anisotropic plasma method such as RIE (or, less preferably, a wet etching method), to remove less than all of the etch protection oxide 50a over the right part of gate WLN1 and to expose the substrate surface 10 of shared N++ drain 45b. Mask boundary 101 leaves a step in oxide 47 as shown in FIG. 15. Thick protection dielectric oxide 49a (a composite of etch protection oxide film 150 and of isolation oxide film 47a) overlies the left part of polysilicon gate WLN1. Sidewall spacer oxide 48a and 48b in FIG. 15 may be somewhat larger after the steps of isolation oxide layer 47a deposition and anisotropic etch-back. The photoresist mask 100 window 102 area is larger than the area of shared drain 45b=CDN. Buried contacts will thus be truly self-aligned to word lines WLN1 and WLN2. The mask window 102 is less critical and much easier to define than prior art contact mask openings.

Figure 16:
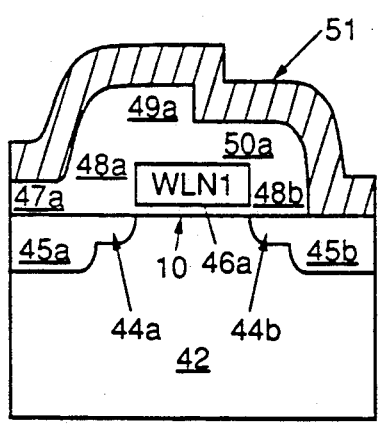

In FIG. 16, preferably a polycide film 51 (a sandwich of a layer of silicide such as Tungsten silicide and a layer of polysilicon) is deposited to a depth of several thousand angstroms and N-type implanted or doped with phosphorus or arsenic dopants. The preferred polycide bit lines may be replaced by N+ doped polysilicon bit lines with the result of higher bit line resistance. Polycide film 51 does not need to be doped heavily because its conductivity is determined mainly by the layer of silicide. Polycide film deposition by a low pressure chemical vapor deposition (LPCVD) process provides excellent (almost 100%) coverage over the step of contact window 102. Polycide film 51 forms a self-aligned buried contact to the shared drain N++ diffusion area 45b, but is dielectrically insulated by isolation oxide 47a, 47b from shared source diffusions regions 44a, 45a and from gate word lines WLN1, WLN2, etc.

Next, over polycide film 51, photoresist is deposited and patterned into a mask (not shown) for defining bit lines BLN. The exposed polycide film areas are removed, preferably by plasma etching, to leave continuous polycide bit lines.

Figure 17:
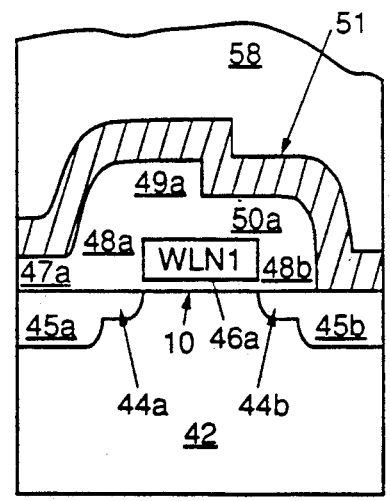

The FIG. 16 structure may be completed by well-known steps of forming a passivation layer 58 (FIG. 17), followed by forming contact windows and metal interconnections for peripheral circuitry (not shown). Metal strapping may be added over polysilicon or polycide bit lines to decrease the bit line resistance and increase device speed if desired. Memory arrays according to the invention having no cell drain contact metal relieves the liability of drain-bit lines shorting to gate-word lines and eliminates the requirement of drain contact-to-poly word line spacing, allowing reducing the cell size in the bit line (Y) direction.

Figure 1:
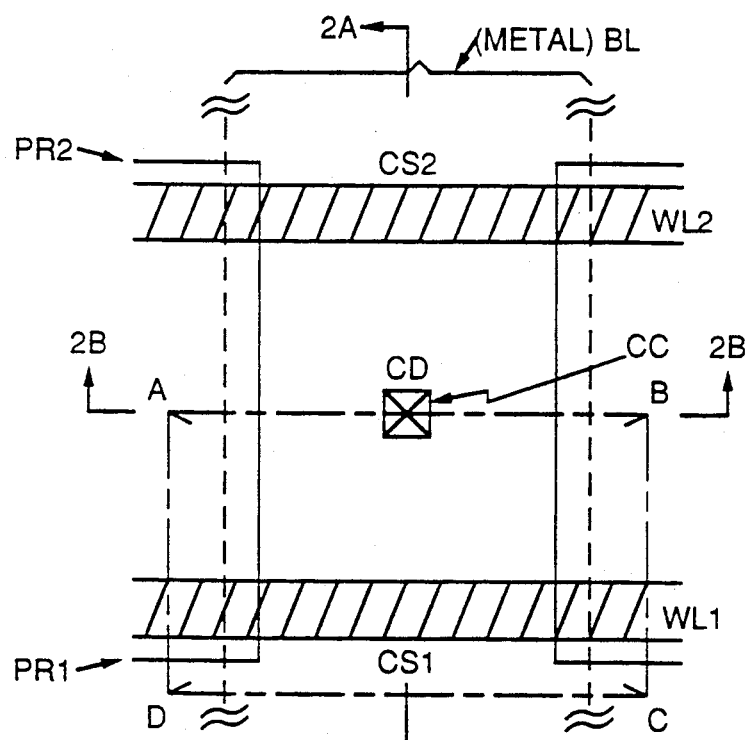
FIG. 1 illustrates a conventional ROM cell layout with a shared source region, a shared drain region, a shared drain contact and a metal bit line.
Figure 2A:
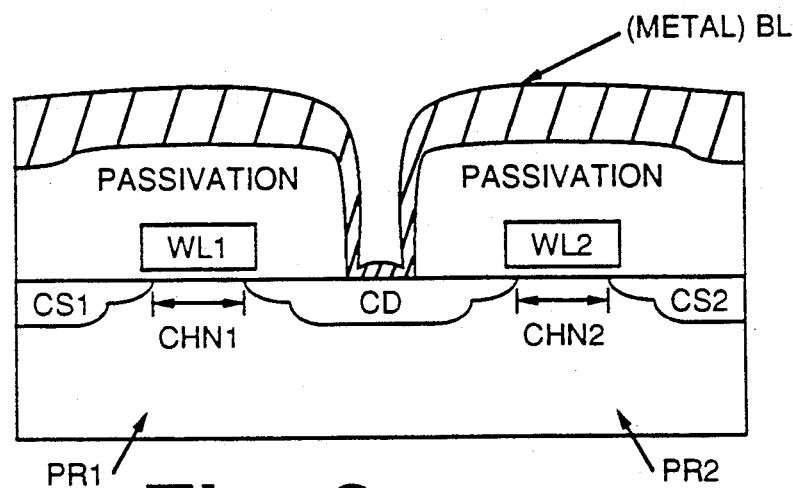
FIG. 2A is a cross-section along the direction of the channel length in the FIG. 1 ROM cell.
Figure 2B:
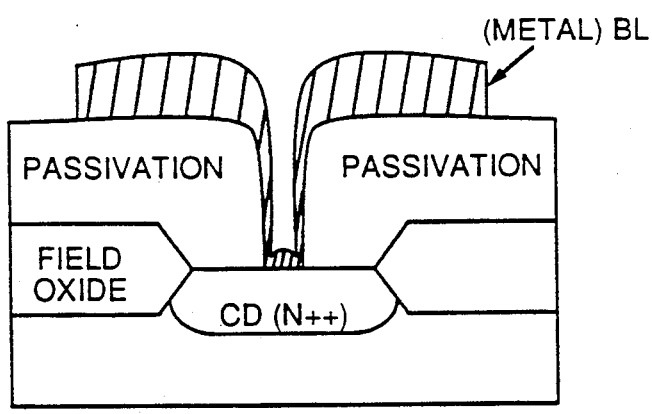
FIG. 2B is a cross-section in the direction parallel to word lines of the FIG. 1 ROM cell.
Figure 3A:
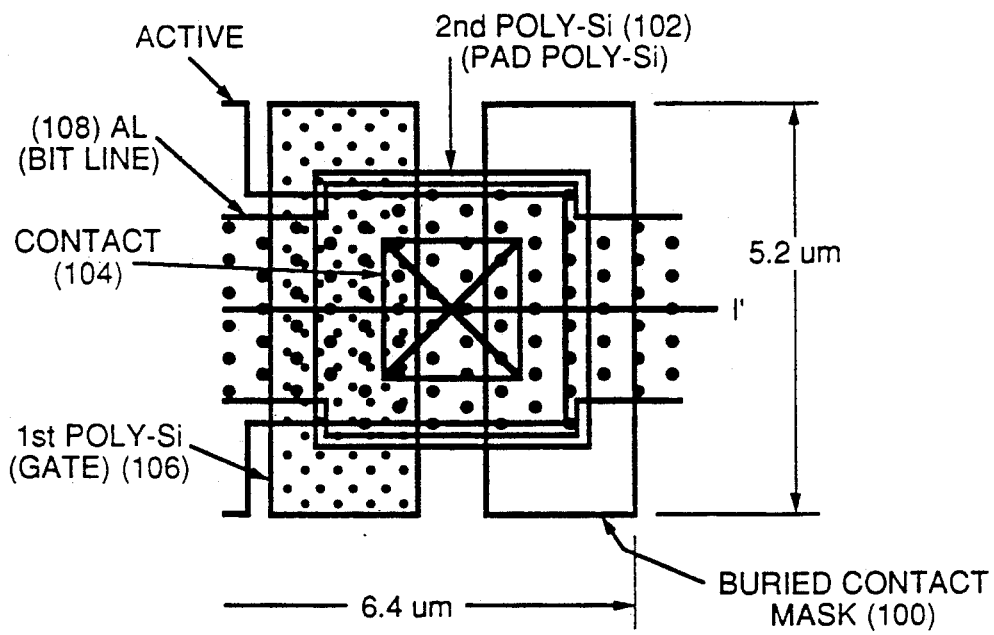
FIG. 3A illustrates the layout of a prior art through-hole programming ROM cell.
Figure 3B:
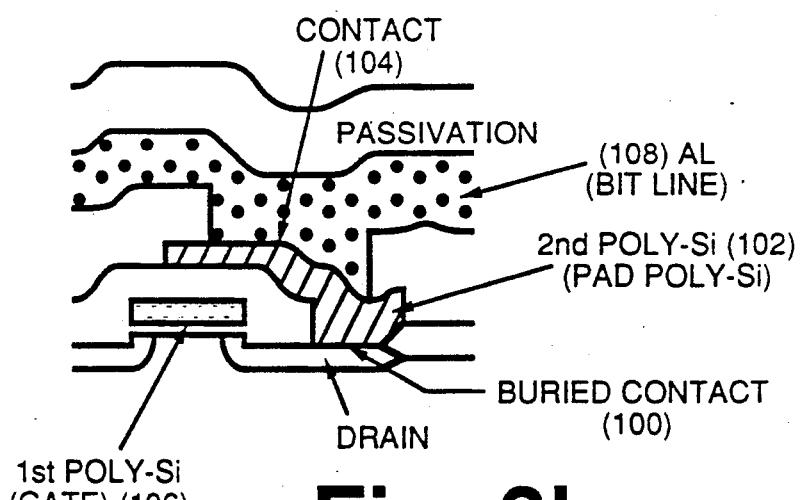
FIG. 3B is a cross-section along the direction of the channel length of the FIG. 3A cell.
Figure 4A:
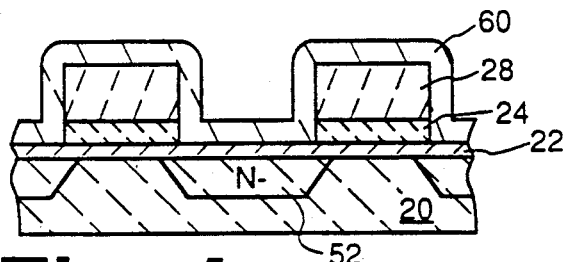
FIGS. 4A to 4D illustrate stages in the fabrication of a prior art self-aligned buried contact cell.
Figure 4B:
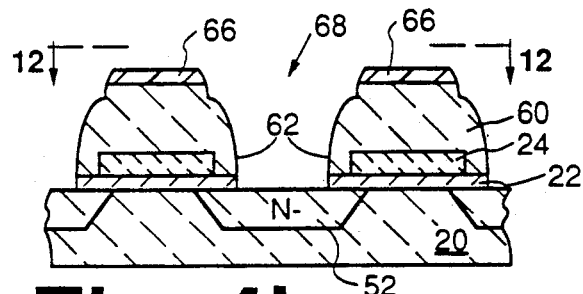
Figure 4C:
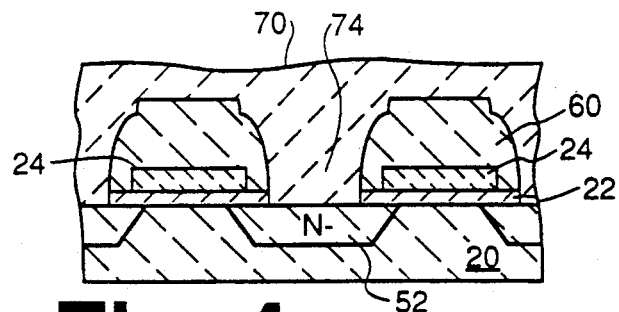
Figure 4D:
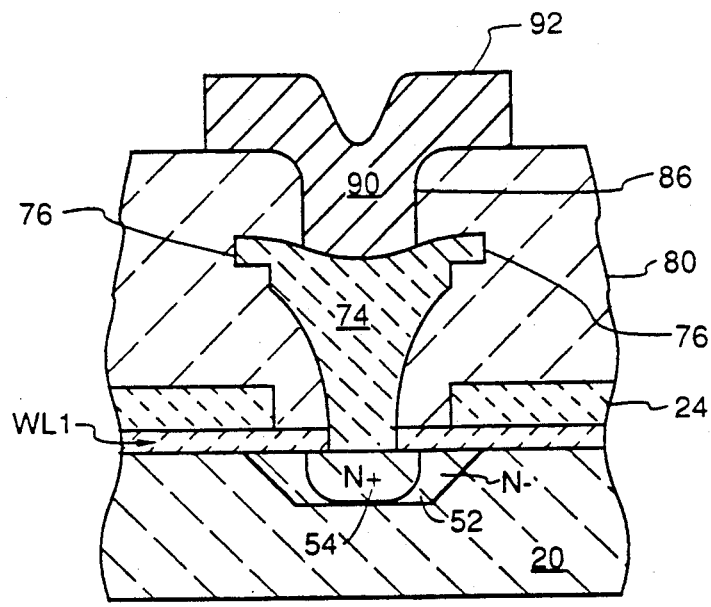
Figure 5:
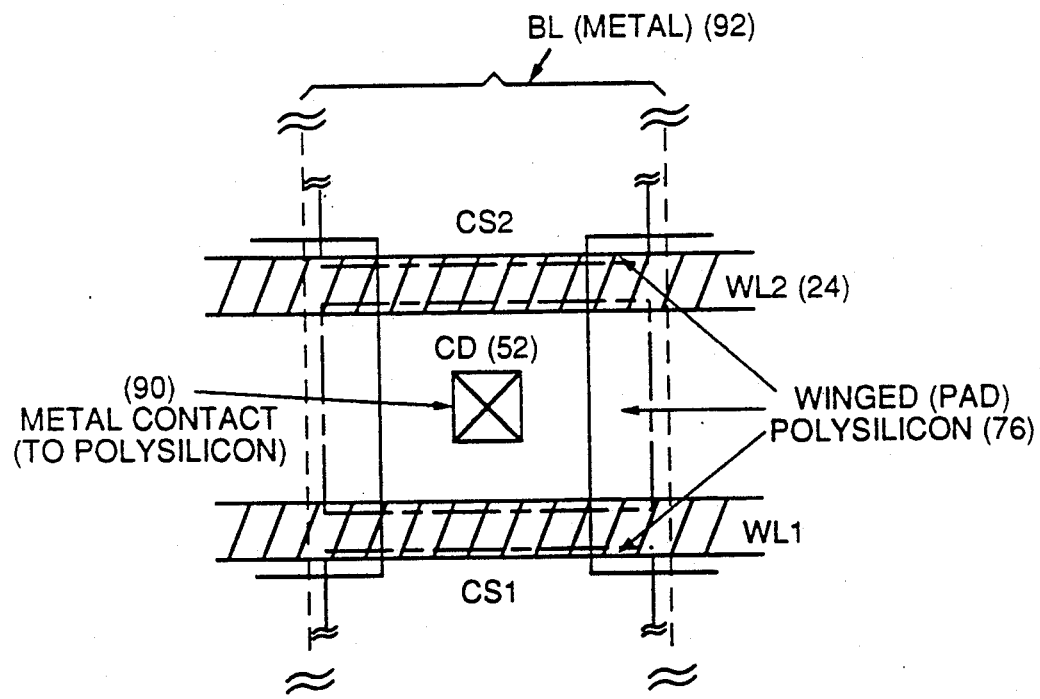
FIG. 5 shows a possible layout for a FIG. 4D type ROM cell.

In contrast to FIG. 1 type prior art ROM cells with metal bit lines which require a sufficient overlap of the contact area, according to the present invention the width of polycide bit lines can be equal to or even narrower than the width of active regions without compromising reliability, so that cell sizes are not limited by the pitch of the bit lines. Similarly, since the active diffusions are not required to overlap the contacts, the active drain region can be reduced to scale down cell size in the word line (X) direction.

This invention can reduce ROM cell sizes to $4L^2$ where L is the minimum spacing design rule. A 1.0 um minimum spacing gives a cell size of 4.0 um$^2$, which is 50% to 70% smaller than prior art cells designed by comparable rules. Ultra-high density (such as 4 or even 16 megabit) ROMs can be implemented in reasonable size dies according to this invention.

Compared to conventional ROM cells hampered by metal contact integrity in scaled-down contacts or over more shallow drain diffusion junctions (metal spiking may occur through shallow junctions), the invented ROM cells have shared drain regions 45b interfacing self-aligned N-doped buried polycide contacts integral with N-doped polycide bit lines 51 which are consistently reliable and offer low resistance. N-type polycide bit lines are expected to have a very low leakage current to P-type substrates because of the reverse-biased diode at the N+ drain 45b junction to the P− substrate during normal operation of the cell, whereas conventional cells with metal bit lines may be misaligned or suffer metal spiking, resulting in high bit line leakage currents to the substrate. Polysilicon or polycide bit lines are easily and cleanly patterned with little risk of bit line bridging.

Figure 18:
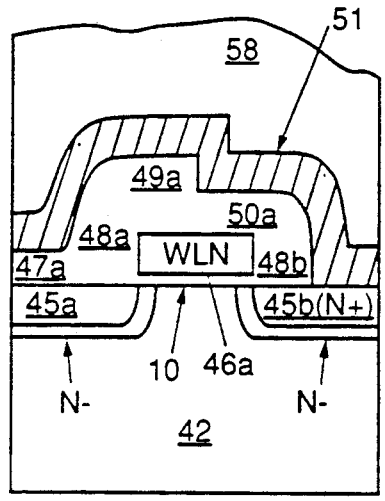
FIG. 18 illustrates a ROM cell in a second embodiment of the invention with double diffused junctions.

While the preferred embodiment is illustrated implemented in an oxide spacer LDD process, the invention is also implementable in disposable poly-spacer LDD, modified LDD, double diffused (DD) junction, and other MOSFET processes. FIG. 18 illustrates a ROM cell formed by a DD process according to this invention.

While for simplicity the preferred embodiment is a ROM cell, the self-aligned buried contact ("contactless") concept of this invention can also be embodied in PROMs, EPROMs, EEPROMs, flash EEPROMs and other MOS memory devices.

Figure 19:
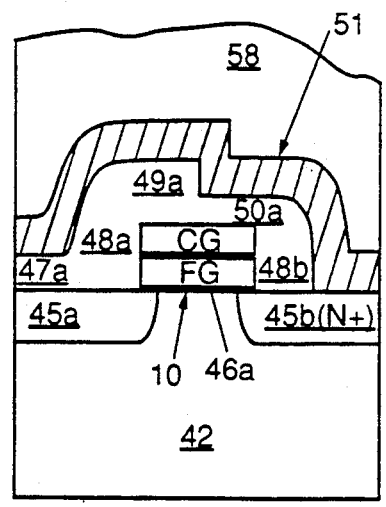
FIG. 19 illustrates an EPROM cell in a third embodiment of the invention.

FIG. 19 illustrates an EPROM cell having a dual gate sandwich of a control gate (CG) and a floating gate (FG) and a drain diffusion surface used with a self-aligned buried contact according to the invention.

Figure 20A:
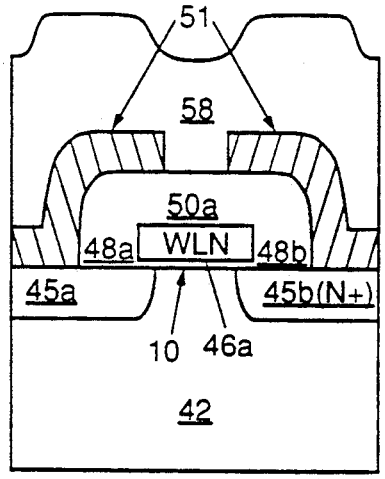
FIG. 20A illustrates an MOS device in a fourth embodiment of the invention with self-aligned buried contacts to both the source and drain regions.

FIG. 20A illustrates a non-LDD MOS device with both its source and drain diffusion regions having self-aligned buried contacts according to the invention.

Figure 20B:
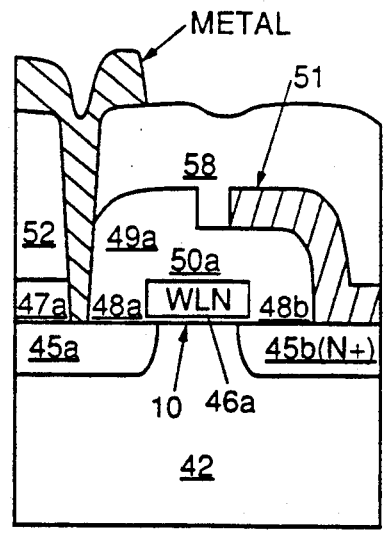
FIG. 20B illustrates an MOS device in a fifth embodiment of the invention with a self-aligned buried contact to the drain region and a metal contact to the source region.

FIG. 20B illustrates a non-LDD device with its drain diffusion region only having a self-aligned buried contact according to the invention and with its source diffusion region having a conventional metal contact.

Figure 21:
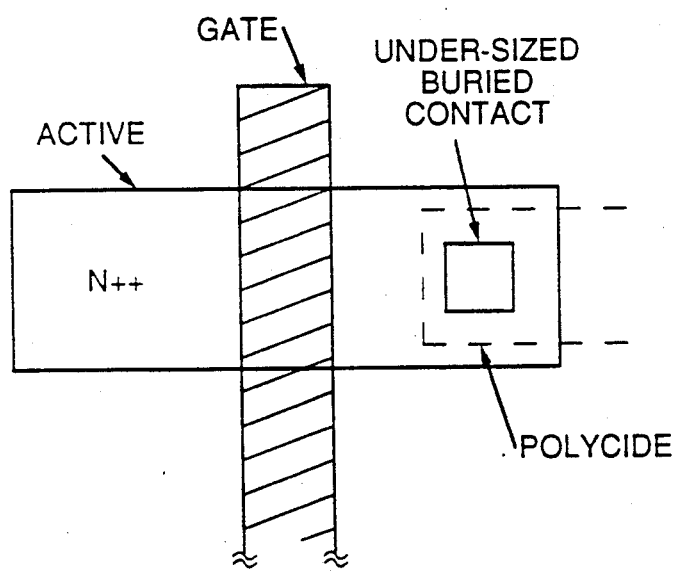
FIG. 21 illustrates an undersized buried contact according to a sixth embodiment of the invention.

FIG. 21 illustrates an undersized buried contact achievable with N++ regular source and drain regions implanted before the formation of self-aligned contacts according to the invention. Undersized buried contacts may allow denser peripheral circuits and thereby decrease IC die sizes.

The invention, although described for N-channel devices, can also be implemented in P-channel embodiments with polycide or polysilicon bit lines and self-aligned buried contacts doped with P-type dopants to make good ohmic connections to surfaces of P+ source and/or drain diffusion regions.

Although the present invention has been described in terms of preferred embodiments, those skilled in the semiconductor art will appreciate that modifications thereof may be made without departing from the essence of the invention. It is intended that the following claims be interpreted as covering any and all modifications falling within the true spirit and scope of the invention.

We claim:

1. A non-volatile memory array cell structure comprising: a plurality of cells including
   a semiconductor substrate of a first conductivity type and having an initial planar upper surface;
   a gate dielectric layer disposed on said surface;
   a gate electrode, having a top and laterally opposite sidewalls, covering said gate dielectric layer;
   a channel region formed in said substrate beneath said gate electrode;
   an etch protection dielectric layer disposed on top of an adjacent respective sidewalls of said gate electrode;
   a regular source region and a regular drain region both of a second conductivity type formed in said substrate beneath respective areas of said upper surface adjacent portions of said protection dielectric layer on respective sidewalls, each said source region between two adjacent cells being shared by those cells, and each said drain region between two adjacent cells being shared by those cells;
   an isolation dielectric layer disposed on said surface over said source region; and
   a conductive film disposed over said etch protection dielectric layer above said gate electrode and continuously directly over said isolation dielectric layer above said source region and forming a self-aligned etched buried contact to said surface over each of said regular drain regions; said conductive film running on top of and in parallel to said drain regions and perpendicular to said source regions.

2. A structure as in claim 1 wherein said conductive film comprises doped polycrystalline silicon.

3. A structure as in claim 1 wherein said conductive film comprises polycide.

4. A structure as in claim 2 wherein said conductive film is strapped with metal film via contacts.

5. A structure as in claim 1 wherein said gate electrode comprises polycrystalline silicon and both said dielectric layers comprise oxides of silicon.

6. A structure as in claim 1 wherein said gate electrode comprises an upper level control gate, a middle level dielectric layer, and a lower level floating gate.

7. A structure as in claim 1 and further comprising:
   a lightly doped source region and a lightly doped drain region of said second conductivity type formed in said substrate beneath portions of said protection dielectric layer which serve as sidewall spacers on respective LDD sidewalls and between respective regularly doped regions and said channel.

8. A structure as in claim 1 wherein said first conductivity type is P-type and said second conductivity type is N-type.

* * * * *